(12) United States Patent
Hoshino (10) Patent No.: US 6,342,447 B1
(45) Date of Patent: Jan. 29, 2002

(54) SEMICONDUCTOR DEVICE AND PRODUCTION METHOD THEREOF

(75) Inventor: Akira Hoshino, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/577,994

(22) Filed: May 25, 2000

(30) Foreign Application Priority Data

May 26, 1999 (JP) ............................................. 11-146125

(51) Int. Cl.$^7$ ..................... H01L 21/44; H01L 23/48; H01L 23/52; H01L 23/40
(52) U.S. Cl. ................... 438/687; 438/653; 438/654; 257/751
(58) Field of Search ................... 438/652, 653, 438/654, 687, 692, 618, 633, 644, 643, 636, 663, 666; 257/751, 622, 763, 628, 767, 774, 761

(56) References Cited

U.S. PATENT DOCUMENTS

| | | | |
|---|---|---|---|
| 5,656,545 A | * 8/1997 | Yu | 438/627 |
| 6,063,707 A | * 5/2000 | Atwater et al. | 438/687 |
| 6,103,618 A | * 8/2000 | Abe | 438/637 |
| 6,135,693 A | * 10/2000 | Chan et al. | 438/633 |
| 6,174,806 B1 | * 1/2001 | Thakur et al. | 438/653 |
| 6,194,307 B1 | * 2/2001 | Chen et al. | 438/626 |
| 6,284,652 B1 | * 9/2001 | Charneski et al. | 438/653 |

FOREIGN PATENT DOCUMENTS

| | | | | |
|---|---|---|---|---|
| JP | 2-143527 | 6/1990 | | |
| JP | 3-217020 | 9/1991 | | |
| JP | 6-140359 | 5/1994 | | |
| JP | 7-292474 | 11/1995 | | |
| JP | 09069522 | * 3/1997 | ....... | H01L/21/3205 |
| JP | 10-259480 | 9/1998 | | |
| JP | 2000208517 | * 7/2000 | ....... | H01L/21/3205 |

OTHER PUBLICATIONS

M.E. Gross et al., "The Roles of Additives in Electroplating of Void–Free Cu in Sub–micron Damascene Features", Sep. 3–4, 1998, pp. 89–90.

Kazuhide Abe et al., "Cu Damascene Interconnects with Crystallographic Texture Control and its Electromigration Performance," 1998, pp. 342–347.

"History and perspective of Cu plating and ULSI metallization," pp. 23–27.

* cited by examiner

Primary Examiner—Charles Bowers
Assistant Examiner—Brook Kebede
(74) Attorney, Agent, or Firm—McGinn & Gibb, PLLC (57) ABSTRACT

An insulation layer 12 is formed on a semiconductor substrate 11 and has a groove 12a for formation of a wiring layer 15 in a predetermined region. A barrier metal is formed on an inner wall of the groove 12a and prevents diffusion of atoms constituting the wiring layer 15, into the insulation layer 12. A seed layer 14 is formed on the barrier metal 13 formed at the bottom of the groove 12a and serves as a kernel of crystal growth when forming the wiring layer 15. The seed layer has crystal orientation of (1 1 1) as a dominant. The wiring layer is formed to bury the groove 12a. Moreover, the wiring layer has crystal orientation of (1 1 1) as a dominant, which suppresses electromigration.

24 Claims, 6 Drawing Sheets

PHOTORESIST

SEMICONDUCTOR DEVICE AND PRODUCTION METHOD THEREOF

BACKGROUND OF THE INVENTION

1. Field of the Invention

The present invention relates to a semiconductor device and production method thereof and in particular, to a semiconductor device having an electromigration resistance and production method thereof.

2. Description of the Related Art

In a semiconductor device, a wiring layer (a groove wiring and a contact plug) is formed for connecting elements formed on a semiconductor substrate each other and connecting elements with a peripheral circuit. Normally, such a wiring layer is made from an aluminium alloy (such as AlCu (aluminium copper) and AlSiCu (aluminium silicon copper).

As the semiconductor device size becomes smaller, a wiring and a contact hole are made smaller. Moreover, in order to improve the semiconductor device performance, it is required to use a wiring having a lower resistance value. A wiring layer having such a low resistance is made from Cu (copper).

Figure 5:
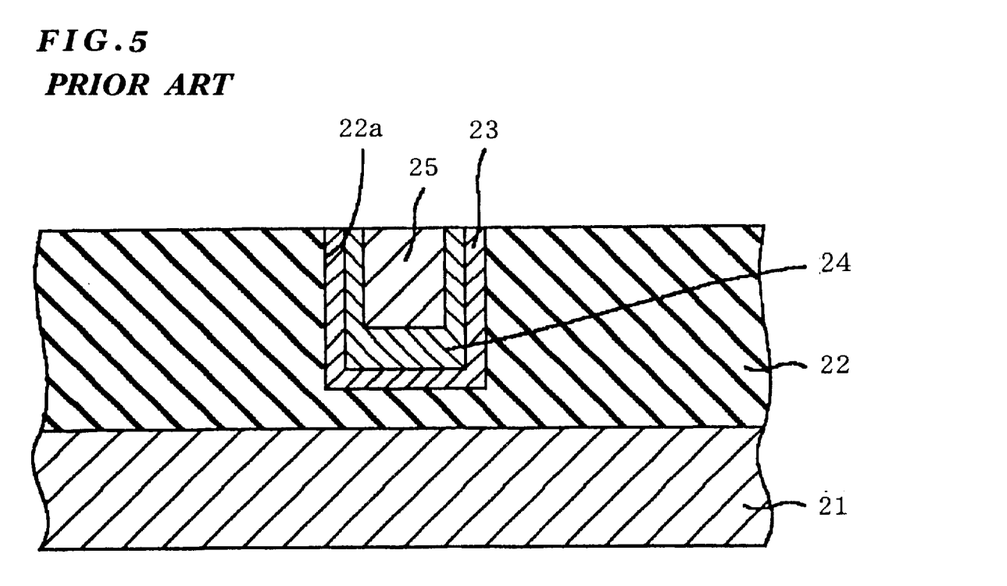
FIG. 5 is a cross sectional view of a conventional wiring layer formation region.

FIG. 5 is a cross sectional view showing a region having the aforementioned wiring layer (wiring layer formation region).

As shown in FIG. 5, the wiring layer formation region includes a semiconductor substrate 21, a insulation layer 22, a barrier metal 23, a seed layer 24, and a wiring layer 25.

The semiconductor substrate 21 is, for example, a Si (silicon) substrate on which elements (not depicted) are formed.

The insulation layer 22 is formed on the semiconductor substrate 21 and has a groove 22a for forming a wiring layer 25. The insulation layer 22 is formed, for example, from $SiO_2$ (silicon dioxide) for insulation between the wiring layer 25 and the other wiring layer (not depicted).

The barrier metal 23 is formed on an inner wall of the groove 22a formed in the insulation layer 22, so as to prevent atoms constituting the wiring layer 25 from diffusion into the insulation layer 22. Moreover, the barrier metal 23 is formed, for example, from TiN (titanium nitride), Ta (tantalum), NaN (tantalum nitride), or the like.

The seed layer 24 is formed on the barrier metal 23 formed on the inner wall of the groove 22a and serves as a kernel for crystal growth of the wiring layer 25. Moreover, the seed layer 24 is formed, for example, from Copper.

The wiring layer 25 is formed on the seed layer 24 to fill the groove 22a. As has been described above, the wiring layer 25 connects the elements formed on the semiconductor substrate 21 one another and connects the elements with a peripheral circuit. Moreover, the wiring layer 25 is formed, for example, from copper.

Next, explanation will be given on the formation of the wiring layer formation region having the aforementioned configuration.

FIG. 6 is a cross sectional view showing a formation procedure of the wiring layer formation region.

Figure 6A:
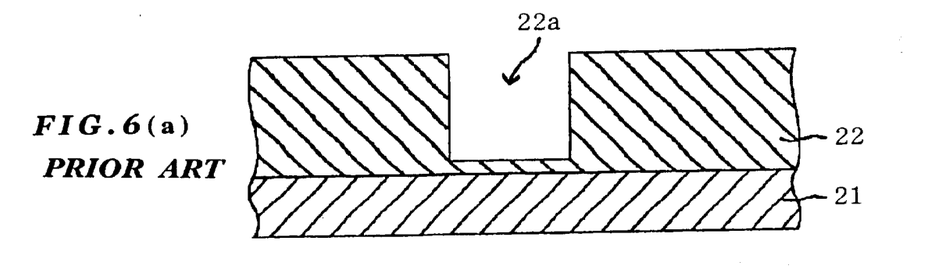
FIGS. 6a–6d are cross sectional view of a formation procedure of the wiring layer formation region of FIG. 5.

Firstly, as shown in FIG. 6(a), the semiconductor substrate 21 is covered by the insulation layer 22 formed by the CVD (chemical vapor phase deposition) method or the like, and a groove 22a is formed by photolithography or etching in a predetermined region of the insulation layer 22, for formation of the wiring layer 25.

Figure 6B:
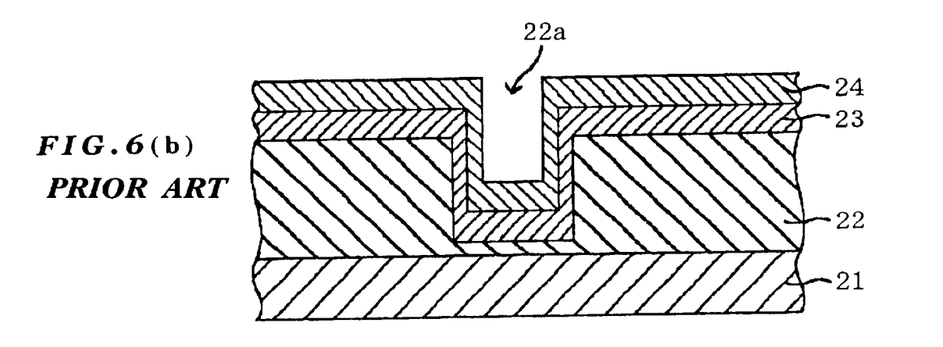

After the groove 22a is formed, as shown in FIG. 6(b), for example, using anisotropic sputtering, the barrier metal 23 and the seed layer 24 are formed in this order on the insulation layer 22 including the inner wall 22a. It should be noted that it is possible to employ the anisotropic technique disclosed Japanese Patent Publication No. 6-140359, Japanese Patent Publication No. 7-292474, and Japanese Patent Publication No. 10-259480.

Figure 6C:
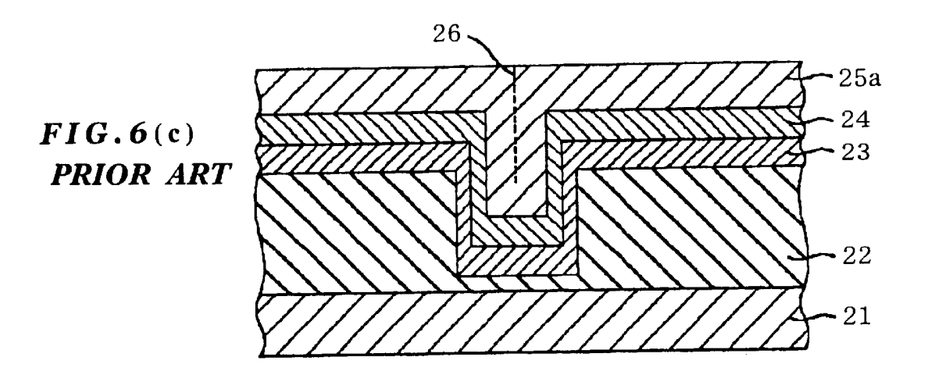

After formation of the barrier metal 23 and the seed layer 24, as shown in FIG. 6(c), a Cu layer 25a is formed on the seed layer 24 by electrolytic plating.

After this, using the CMP (chemical mechanical polishing) method or the like. the barrier metal 23, the seed layer 24, and the Cu layer 25a are polished so as to expose a surface of the insulation layer 22. Thus, the wiring layer 25 is formed to complete the wiring layer formation region shown in FIG. 5.

Figure 6D:
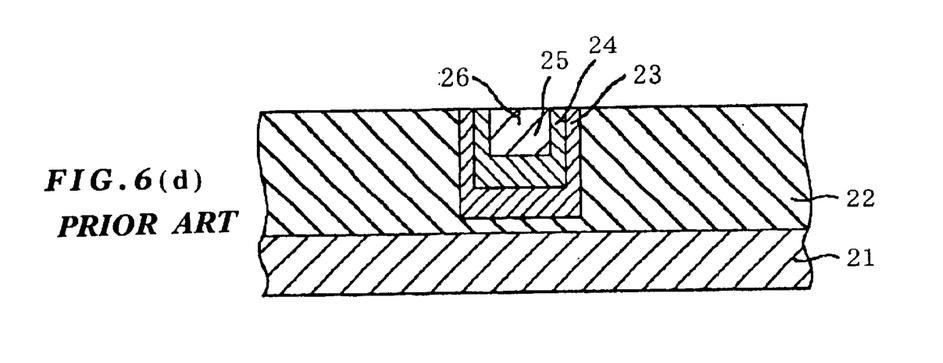

In the formation of the wiring layer 25 (Cu layer 25a) by the electrolytic plating, since the wiring layer 25 almost uniformly grows on the seed layer 24, there is a case that a sheath (seam) 26 remains in the wiring layer 25 as shown in FIGS. 6(c) and 6(d). If the sheath 26 is present in the wiring layer 25, the sheath is clogged with abrasive (silica and alumina particles) during the polishing by the CMP method. This significantly lowers the reliability of the wiring layer 25 and the yield of the semiconductor device production.

As a method to remove the aforementioned sheath 26, for example, there is an electrolytic plating method called bottom-up fill. This bottom-up fill is disclosed, for example, in the "Cu Haisen Gizyutu no Saisinno Tenkai (New Development of Cu Wiring Technology)" Realize Co., Ltd. p. 23 [1] and "The Role of Additives an Electroplating of Void-Free Cu in Sub-micron Damascene Features" [2].

Figure 7A:
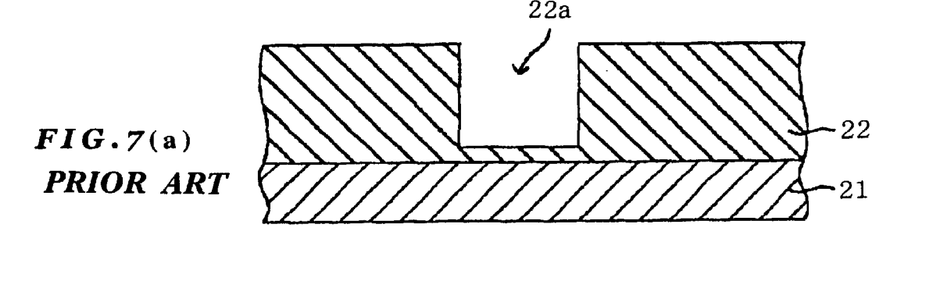
FIGS. 7a–7d are cross sectional view of a formation procedure of the Cu layer (wiring layer) by a conventional bottom-up fill method.
Figure 7B:
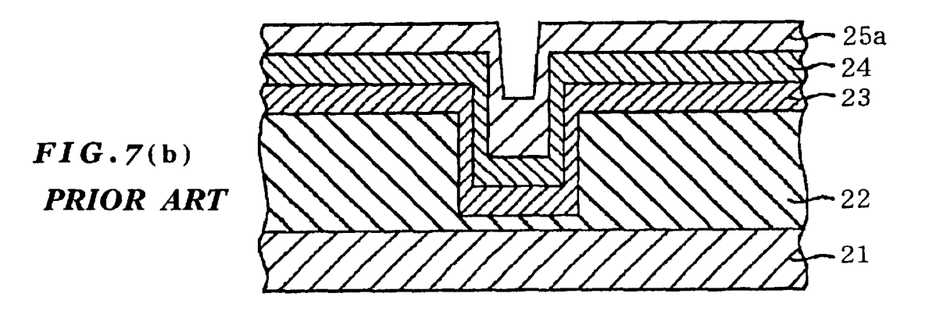
Figure 7C:
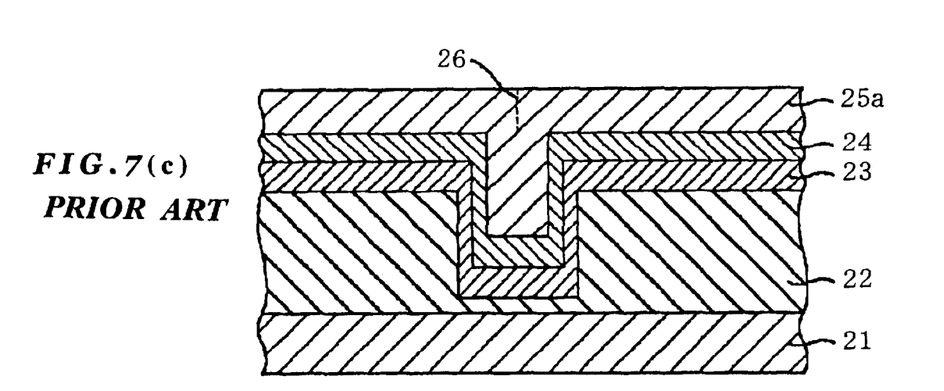
Figure 7D:
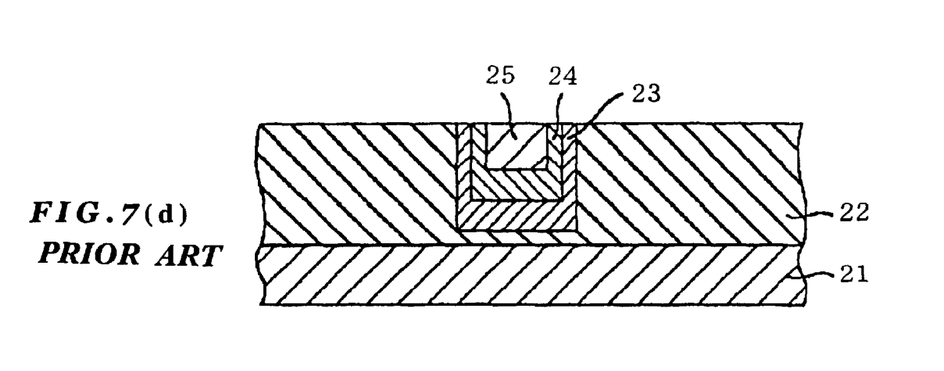

The bottom-up fill is a technique for increasing the film formation speed from the bottom of the groove (hole) by putting an additive into the plating liquid and periodically applying field reversing. As shown in FIG. 7(a) and FIG. 7(b), in the bottom-up fill, the growth speed of the Cu layer (wiring layer 25) 25a from the bottom of the groove 22a is higher than the growth speed from the insulation layer 22 or the side wall of the groove 22a. Accordingly, the sheath 26 present in the Cu layer 25a is short as shown in FIG. 7(c). Consequently, after the barrier metal 23, the seed layer 24, and the Cu layer 25a are polished by the CMP method, the sheath 26 may be absent from the wiring layer 25 as shown in FIG. 27(d).

In the technique forming the wiring layer 25 by the electrolytic plating, there is a problem that electromigration of the wiring layer 25 is easily caused.

The electromigration is described, for example, in the "Cu Damascene Interconnects with Crystallographic Texture Control and its Electromigration Performance", Kazuhide Abe et al. 1998, IEEE IRPS, p 342 [3]. Document [3] shows an experiment result that the electromigration is not caused easily when the (1 1 1) orientation of the Cu wiring layer is strong, and the electromigration is easily caused when the (1 1 1) orientation of the Cu wiring layer is weak, i.e., other than the (1 1 1) orientation is strong.

In the production method shown in FIG. 6, since the crystal orientation of the seed layer 24 is not controlled, there is a case that other than the (1 1 1) orientation is dominant in the wiring layer 25 growing on the seed layer 24. When other than the (1 1 1) orientation is dominant in the wiring layer 25, electromigraiton is easily caused, which results in lowering operation reliability of a semiconductor device produced.

SUMMARY OF THE INVENTION

It is therefore an object of the present invention to provide a semiconductor device which can improve the operation reliability. Another object of the present invention is to provide a semiconductor device production method suppressing electromigration.

In order to achieve the aforementioned object, the semiconductor device production method according to an aspect of the present invention comprises steps of: forming an insulation layer on a substrate for insulation between wires; forming a groove in a predetermined region of the insulation layer for forming a wiring layer; forming a barrier layer on an inner wall of the groove for preventing diffusion of atoms constituting the wiring layer, into the insulation layer; forming a seed layer serving as a kernel for crystal growth when forming the wiring layer in such a manner that substantially (1 1 1) orientation can be obtained; and forming a wiring layer having a substantially (1 1 1) orientation on the seed layer so as to bury the groove.

According to this invention, by making orientation of the seed layer substantially (1 1 1), the wiring layer formed there on can also have substantially (1 1 1) orientation. Accordingly, electromigration is not easily caused, improving the operation reliability of the semiconductor device produced.

The seed formation step may includes a step of forming the seed layer on the barrier layer at the bottom of the groove.

Thus, in the groove, the wiring layer grows only in one direction and no seam is present in the wiring layer formed.

The aforementioned seed formation step may include a step of forming the seed layer by anisotropic sputtering.

The seed formation step may include an etching step for etching and removing the seed layer formed on the side wall of the groove.

The seed formation step may include a step of forming the seed layer from a material not melted by a plating liquid.

The seed formation step may include a step of forming the seed layer from copper and the wiring formation step may include a step of forming the wiring layer from copper.

According to another aspect of the present invention, there is provided a semiconductor device comprising: an insulation layer formed on a substrate and having a groove for forming a wiring layer in a predetermined region; a barrier layer formed on an inner wall of the groove for preventing diffusion of atoms constituting the wiring layer, into the insulation layer; a seed layer formed on the barrier layer so as to serve as a kernel of crystal growth when forming the wiring layer and having substantially (1 1 1) orientation; and a wiring layer formed on the seed layer so as to bury the groove and having substantially (1 1 1) orientation.

According to this invention, the wiring layer has substantially (1 1 1) orientation and electromigration is not easily caused. Accordingly, the semiconductor device has a high operation reliability.

The seed layer may be formed on the barrier layer at the bottom of the groove.

The seed layer may be formed from coper, and the wiring layer may be formed from copper.

DESCRIPTION OF THE PREFERRED EMBODIMENTS

Next, explanation will be given on a semiconductor device according to a first embodiment of the present invention with reference to the attached drawings.

In the semiconductor device, a plurality of elements are formed and a wiring layer is formed for connecting the elements one another and connecting the elements with a peripheral circuit.

Figure 1:
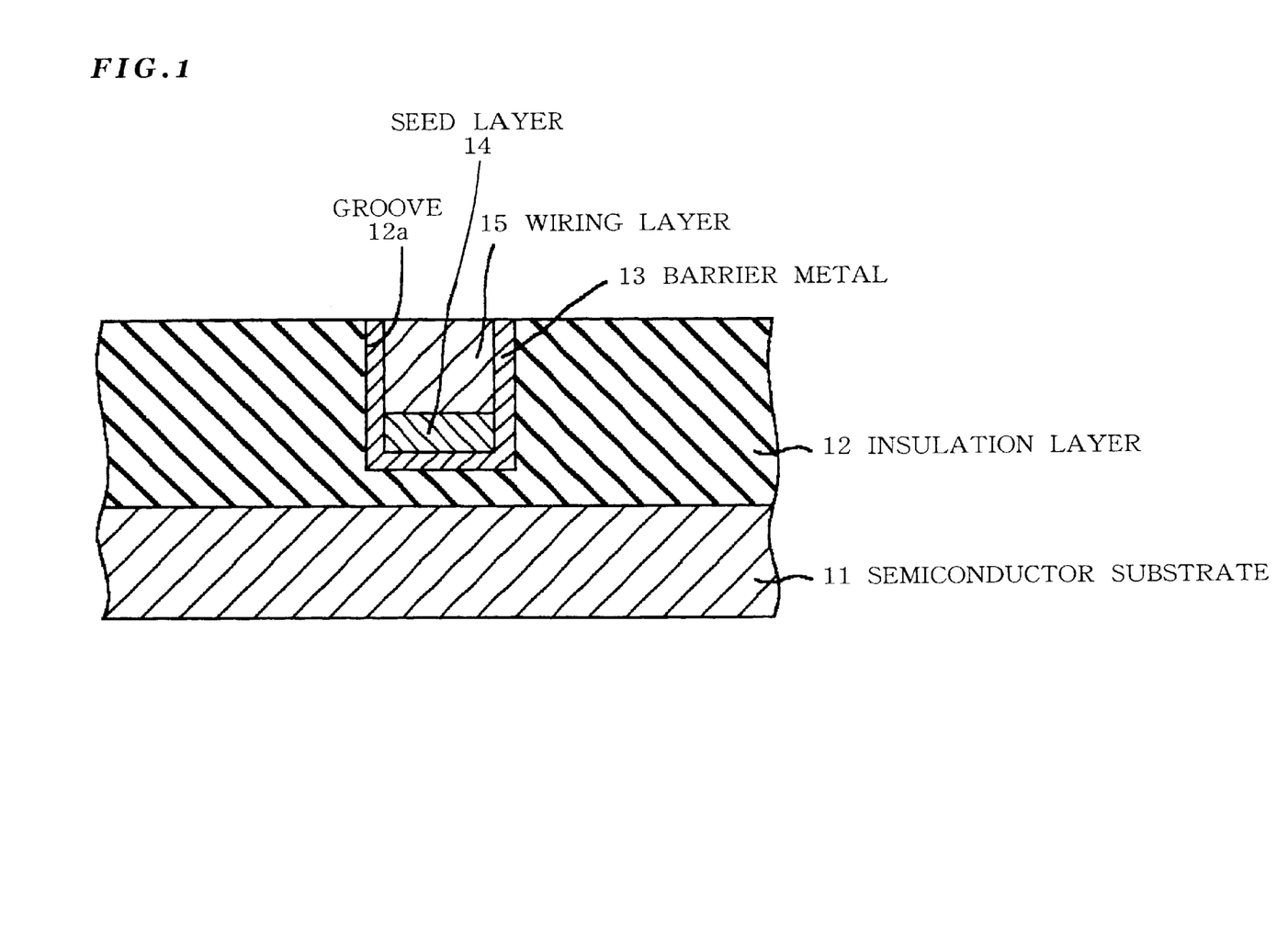
FIG. 1 is a cross sectional view of a wiring layer formation region of a semiconductor device according to a first embodiment of the present invention.

FIG. 1 is a cross sectional view showing a configuration of a region where the aforementioned wiring layer is formed (wiring layer formation region).

As shown in FIG. 1, the wiring layer formation region of the semiconductor device includes a semiconductor substrate 11, an insulation layer 12, a barrier metal 13, a seed layer 14, and a wiring layer 15.

The semiconductor substrate 11 is, for example, a Si (silicon) substrate on which elements (not depicted and a lower layer wiring (not depicted) for connecting the elements are formed.

The insulation layer 12 is formed on the semiconductor substrate 11 and serves to insulate an upper wiring layer from the lower wiring layer or the wiring layer 15 from another wiring layer (not depicted). The insulation layer 12 is made from, for example, $SiO_2$ (silicon dioxide). Moreover, the insulation layer 12 has a groove 12a for forming the wiring layer 15.

The barrier metal 13 is formed on an inner wall of the groove 12a for preventing diffusion of atoms constituting the wiring layer 15 into the insulation layer 12. The barrier metal 13 is made from, for example, TiN (titanium nitride), Ta (tantalum), TaN (tantalum nitride), or the like.

The seed layer 14 is formed on the barrier metal 13 at the bottom of the groove 12a. The seed layer 14 serves as a kernel for crystal growth of the wiring layer 15 and is made from Cu (copper) for example. The boundary between the seed layer 14 and the wiring layer 15 has (1 1 1) orientation.

The wiring layer 15 is a groove wiring formed on the seed layer 14 in the groove 12a and serves to connect the elements constituting the semiconductor device one another and connect the elements with a peripheral circuit. Moreover, the wiring layer 15 is made from, for example, Cu and has a strong (1 1 1) orientation. It should be noted that although not depicted, the wiring layer 15 may be covered with an insulation layer on which an upper wiring layer is formed.

Next, explanation will be given on a formation method of the wiring layer formation region having the aforementioned configuration. FIG. 2(a) to FIG. 2(e) are cross sectional views showing the formation steps of the wiring layer formation region.

Figure 2A:
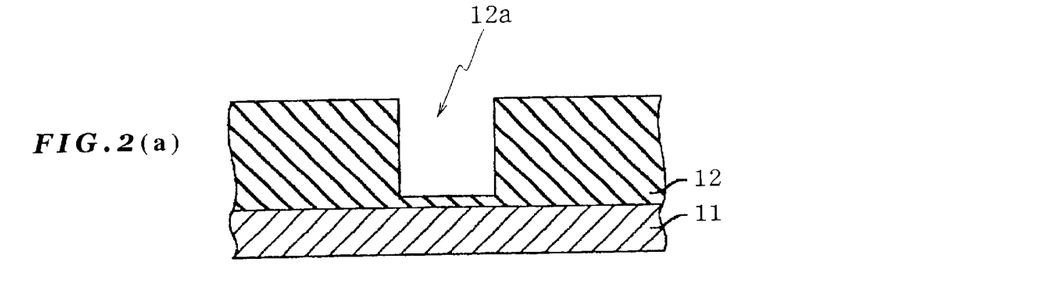
FIGS. 2a–2e are cross sectional view of a formation procedure of the wiring layer formation region of FIG. 1.

Firstly, an insulation layer 12 is formed on the semiconductor substrate 11 by using the CVD (chemical vapor phase deposition) method or the like. Next, using the photolithography, etching, or the like, a groove 12a is formed in the insulation layer 12 as shown in FIG. 2(a). The size of this groove 12a is, for example, 0.3 micrometers in width and 1.0 micrometers in depth.

Figure 2B:
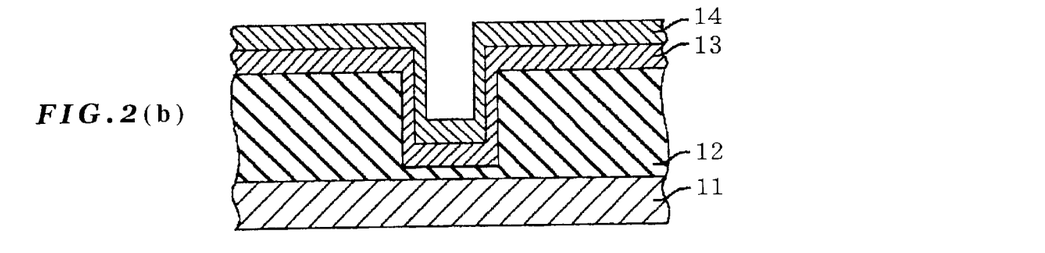

After formation of the groove 12a, using the anisotropic sputtering, for example, as shown in FIG. 2(b), a barrier metal 13 and a seed layer 14 are formed in this order on the insulation layer 12 including the inner wall of the groove 12a. It should be noted that the anisotropic sputtering is, for example, collimate sputtering.

In the collimate sputtering, a collimator having a number of holes open to a vertical direction to the surface of the insulation layer 12 is placed between a target and the insulation layer 12. Thus, sputtering particles fly onto the surface of the insulation layer 12 almost in vertical direction and is accumulated there.

Thus, it is possible to increase the bottom coverage of the barrier metal 13 and the seed layer 14 formed in the groove 12a.

Moreover, since the sputtering particles fly almost in vertical direction to the surface of the insulation layer 12, the barrier metal 13 and the seed layer 14 have a greater thickness on the surface of the insulation layer 12 and at the bottom of the groove 12a than the side wall of the groove 12a. It should be noted that the film thickness at the bottom of the groove 12a is set according to the aspect ratio of the groove 12a. For example, if the groove width is 0.3 micrometrs and the groove depth is 1.0 micrometer, a collimator used has a hole size defined as depth:diameter= 1:1.5. And it is preferable to form the barrier metal 13 with a thickness of 40 nm and the seed layer 14 with a thickness of 100 nm at the bottom of the groove 12a.

Moreover, it is necessary to form the seed layer 14 at the bottom of the groove 12a so as to have a strong (1 1 1) orientation. As a method to form the seed layer 14 having a strong (1 1 1) orientation at the bottom of the groove 12a, it is possible to use a technique disclosed in the aforementioned document [3]. However, on the side wall of the groove 12a, unlike at the bottom of the groove 12a, the crystal growth of the sputter particles is difficult to be controlled concerning the film characteristic and orientation. For this, in the seed layer 14 formed on the side wall of the groove 12a by the sputtering, other than (1 1 1) orientation is dominant.

Figure 2C:
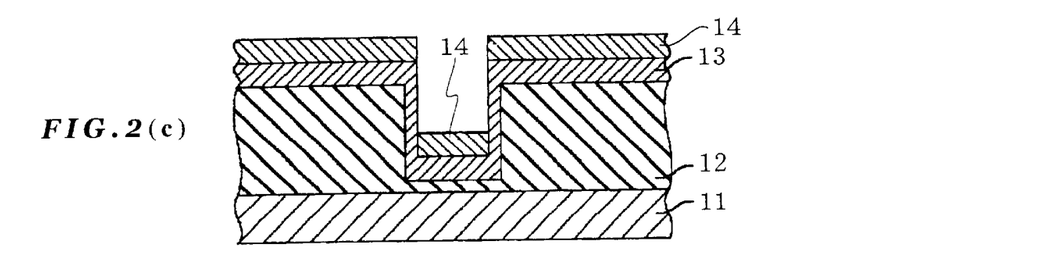

After this, as shown in FIG. 2(c) the seed layer 14 formed on the side wall of the groove 12a is subjected to wet etching. Here, it is necessary to use an etching liquid having a large difference of etching against the seed layer 14 and the barrier metal 13 such as sulfuric acid, aqueous solution of copper sulfate, or sulfuric acid hydrogen peroxide mixture (SPM). It should be noted that since the formation of the wiring layer 15 is easier when the seed layer 14 on the surface of the insulation layer 12 including the bottom of the groove 12a is thicker, the aforementioned etching is regulated in time so that the seed layer 14 is left as thicker as possible on the surface of the insulation layer 12 including the bottom of the groove 12a. Thus, by removing the seed layer 14 from the side wall of the groove 12a, it is possible to leave only a portion of the seed layer 14 having the strong (1 1 1) orientation.

Figure 2D:
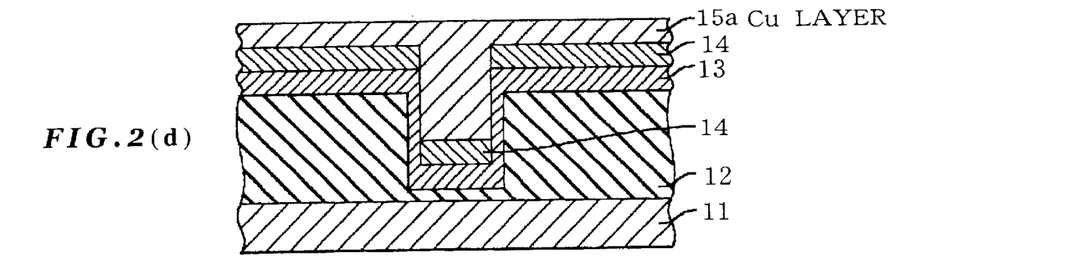

After etching of the seed layer 14, electrolytic plating is performed so that the seed layer 14 at the bottom of the groove 12a precipitates copper onto the seed layer 14, forming a Cu layer 15a. As has been described above, the seed layer 14 on the side wall of the groove 12a, dominant orientation is other than (1 1 1). For this, if the Cu layer 15a is formed without etching the seed layer 14, The Cu layer 15a growing from the side wall of the groove 12a also has orientation dominant other than (1 1 1), which easily causes electromigration. On the other hand, as has been described above, if the seed layer 14 has been etched so that the seed layer 14 having a strong (1 1 1) orientation serves as a kernel of crystal growth to form the Cu layer 15a, it is possible to obtain the Cu layer 15 having a strong (1 1 1) orientation.

Figure 2E:
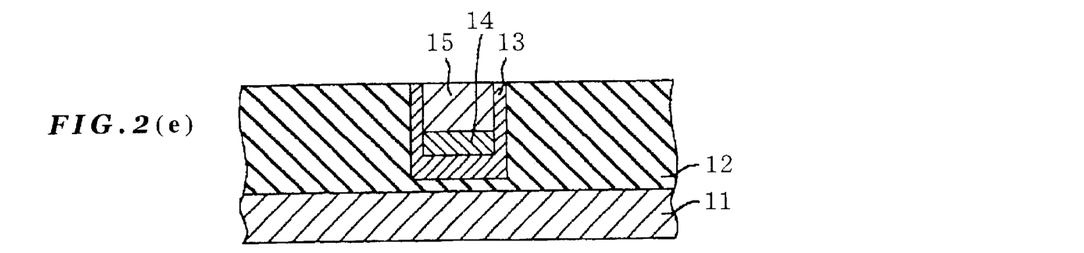

After formation of the Cu layer 15a, using the CMP method or the like, the barrier metal 13, the seed layer 14, and the Cu layer 15a are polished until the surface of the insulation layer 12 is exposed. Thus, the wiring layer 15 is formed as shown in FIG. 2(e), completing the wiring layer formation region shown in FIG. 1.

As has been described above, after the seed layer 14 on the side wall of the groove 12a is removed, the wiring layer 15 is formed by electrolytic plating. Accordingly, it is possible to form the wiring layer 15 (Cu layer 15a) without any seam and having a strong (1 1 1) orientation. Consequently, the wiring layer 15 increases its electromigraiton resistance, reducing a wire breakage, which in turn improve the operation reliability of the semiconductor device.

Next, explanation will be given on a semiconductor device according to a second embodiment of the present invention with reference to the attached drawings.

In the semiconductor device of the second embodiment, the wiring formation region is substantially identical to that of the first embodiment.

Hereinafter, explanation will be given on the formation method of the wiring formation region.

In the second embodiment, a barrier metal 13 and a seed layer 14 are successively formed on the insulation layer 12 including the inner wall of the groove 12a, and the seed layer 14 formed on the side wall of the groove 12a is removed. That is, the steps up to FIG. 2(c) are identical as the first embodiment. It should be noted that the seed layer 14 formed at the bottom of the groove 12a has a strong (1 1 1) orientation similarly as in the first embodiment.

Figure 3A:
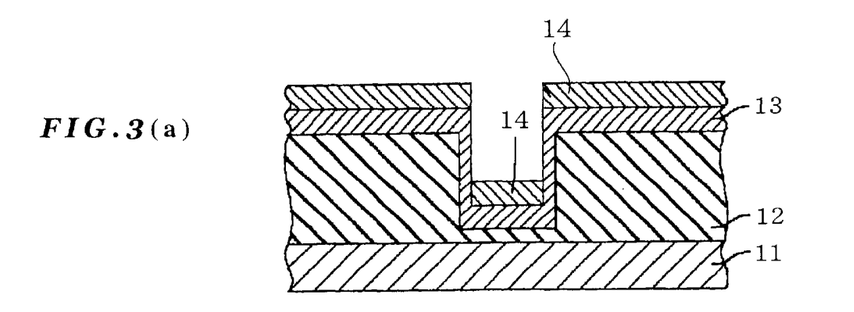
FIGS. 3a–3e are cross sectional view of a formation procedure of a wiring layer formation region according to a second embodiment of the present invention.
Figure 3B:
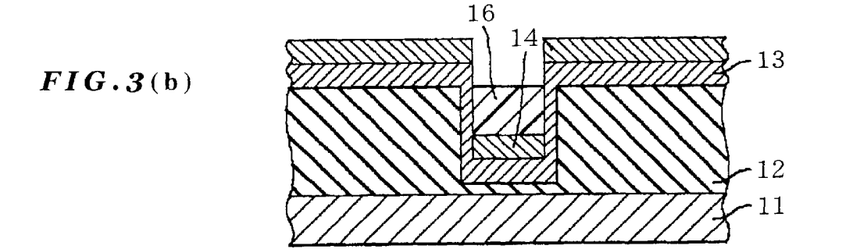

In the second embodiment, as shown in FIG. 3(a) (FIG. 2(c)), after the seed layer 14 is removed from the side wall of the groove 21a, the spin coat method or the like is used to form a positive type photoresist 16 on the remaining seed layer 14 including the groove 21a, and then exposure amount is regulated so that the photoresist 16 remains only inside the groove 12a as shown in FIG. 3(b).

Figure 3C:
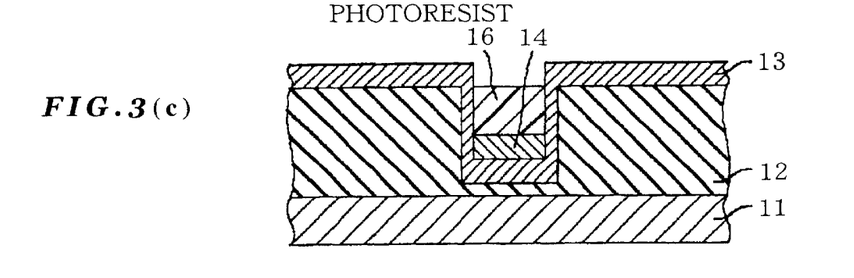

Next, using an etching liquid (such as SPM) having a preferable etching selection ratio with the barrier metal 13, so as to remove the seed layer 14 from the surface of the insulation layer 12 by wet etching as shown in FIG. 3(c). It should be noted that in this etching, the concentration and temperature of the etching liquid (such as SPM) are adjusted for obtaining a preferable etching selection ratio with the photoresist 16. For example, in a case of SPM, at the temperature of 24 degrees C, the ratio of $H_2SO_4$: $H_2O_2$: $H_2O$ is adjusted to be 1:6:100. Moreover, prior to the wet etching, the photoresist 16 may be subjected radiation of ultraviolet rays or may be baked. This hardens the photoresist 16 and increases the etching selection ratio.

Figure 3D:
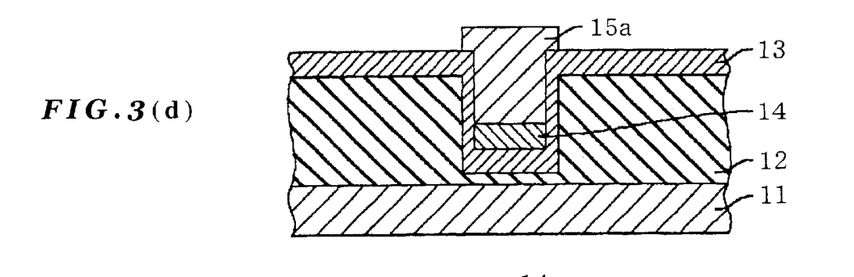

Next, an ordinary organic solvent is used to remove the photoresist 16 from the groove 12a. Then, as shown in FIG. 3(d), electrolytic plating is performed to precipitate copper on the seed layer 14 to form a Cu film 15a.

Figure 3E:
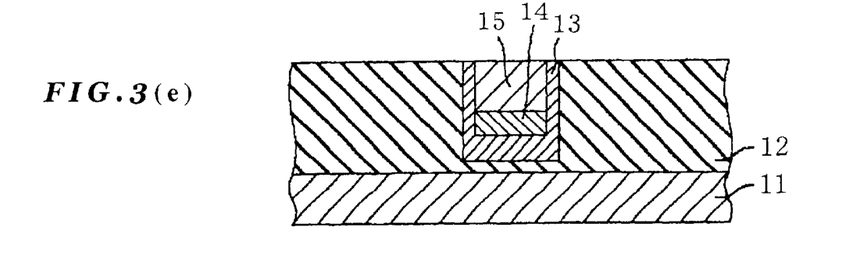

After formation of the Cu film 15a, the CMP method is used to polish the barrier metal 13 and the Cu layer 15a so as to expose the surface of the insulation film 12. Thus, as shown in FIG. 3(e), the wiring layer 15 is formed to complete the wiring layer formation region as shown in FIG. 1.

As has been described above, for the formation of the Cu film 15a, the seed layer 14 is present only at the bottom of the groove 12a, no seam is formed even with an ordinary electrolytic plating. Moreover, since the Cu film 15a grows only from the bottom of the groove 12a, it is possible to form the wiring layer 15 having a strong (1 1 1) orientation. Accordingly, electromigration is not easily caused and it is possible to improve the operation reliability of the semiconductor device.

Figure 4:
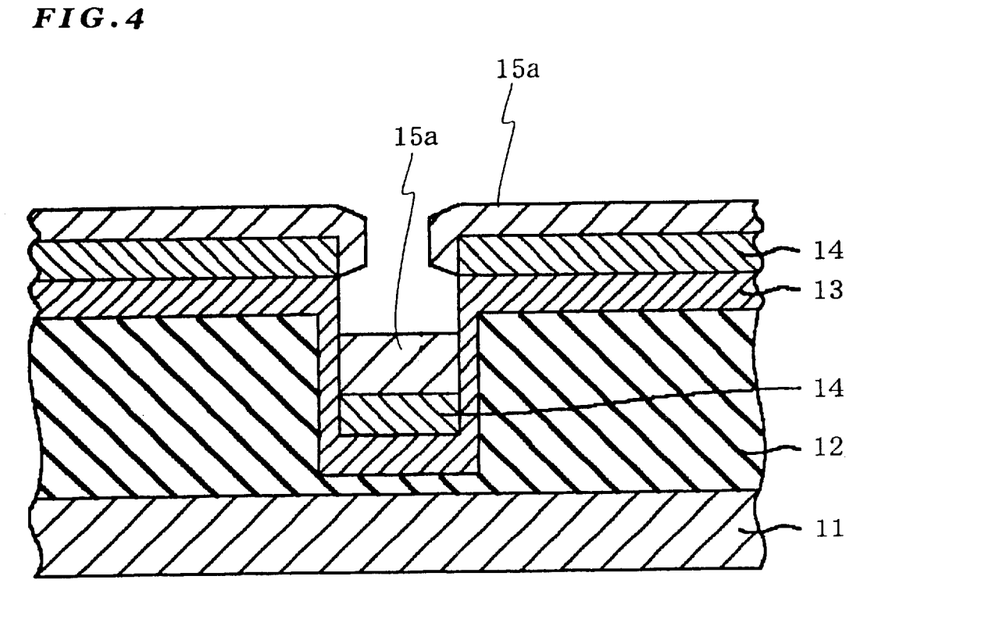
FIG. 4 is a cross sectional view showing a growth process of a Cu layer (wiring layer) in the first embodiment.

It should be noted that when the Cu layer 15a is formed in the first embodiment, it is possible to add an additive to the plating liquid (such as copper sulfate solution) and to periodically apply field reversing, so that the growth of the Cu layer 15a from the bottom of the groove 12a is faster than from the surface of the insulation layer 12. In the first embodiment, as has been described above, the seed layer 14 is left at the bottom of the groove 12a and on the surface of the insulation layer 12 by etching. Accordingly, as shown in FIG. 4(a), the Cu layer 15a also grows from the seed layer 14 above the groove 12a and forms overhang. However, by increasing the growth of the Cu layer 15a from the bottom of the groove 12a, it is possible to minimize the affect by the overhang. Thus, it is possible to form a preferable Cu layer 15a (wiring layer 15). It should be noted that in the second embodiment, in which the seed layer 14 is removed from the surface of the insulation layer before growing the Cu layer 15a and there is no affect by the aforementioned overhang.

Moreover, the seed layer 14 in the first and the second embodiment may be other than copper if it does not melt in the plating liquid, has a low resistance, and strong (1 1 1) orientation.

The technique to form a wiring layer in a groove formed in an insulation layer is also disclosed in Japanese Patent Publication No. 3-217020 [4] and Japanese Patent No. 2734027 [5]. Documents [4] and [5] disclose a technique to use CVD (chemical vapor deposition) method to form a wiring layer in a groove. In the CVD method, the wiring layer growth selection is performed between a metal film and an insulation film. For this, as has been described above, in a case when a barrier metal 13 is formed on the inner wall of the groove 12a, the Cu layer 15a grows not only from the seed layer 14 but also from the barrier metal 13 on the side wall of the groove 12a. As has been described above, it is difficult to form a layer (film) having a strong (1 1 1) orientation on the side wall of the groove 12a. Accordingly, using the CVD method, it is impossible to form the Cu layer 15a (wiring layer 15) having a strong (1 1 1) orientation.

As is clear from the above-given explanation, the present invention enables to form a wiring layer having a substantially (1 1 1) orientation on the seed layer having a substantially (1 1 1) orientation. This suppresses electromigration and improve the operation reliability of the semiconductor device.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-146125 (Filed on May 26, 1999) including specification, claims, drawings and summary are incorporated herein by reference in its entirety.

What is claimed is:

1. A semiconductor device production method comprising steps of:

forming an insulation layer on a substrate for insulation between wires;

forming a groove in a predetermined region of said insulation layer for forming a wiring layer;

forming a barrier layer on an inner wall of said groove for preventing diffusion of atoms constituting said wiring layer, into said insulation layer;

forming a seed layer serving as a kernel for crystal growth when forming said wiring layer in such a manner that substantially (111) orientation can be obtained; and forming a wiring layer having a substantially (111) orientation on said seed layer so as to bury said groove.

2. A semiconductor device production method as claimed in claim 1, wherein said seed formation step includes a step of forming said seed layer on said barrier layer on a bottom of said groove.

3. A semiconductor device production method as claimed in claim 2, wherein said seed formation step includes a step of forming said seed layer by anisotropic sputtering.

4. A semiconductor device production method as claimed in claim 1, wherein seed formation step includes an etching step for etching and removing the seed layer formed on a side wall of said groove.

5. A semiconductor device production method as claimed in claim 2, wherein seed formation step includes an etching step for etching and removing the seed layer formed on a side wall of said groove.

6. A semiconductor device production method as claimed in claim 3, wherein seed formation step includes an etching step for etching and removing the seed layer formed on a side wall of said groove.

7. A semiconductor device production method as claimed in claim 1, wherein said wiring formation step includes a step of electrolytic plating of said wiring layer.

8. A semiconductor device production method as claimed in claim 2, wherein said wiring formation step includes a step of electrolytic plating of said wiring layer.

9. A semiconductor device production method as claimed in claim 3, wherein said wiring formation step includes a step of electrolytic plating of said wiring layer.

10. A semiconductor device production method as claimed in claim 4, wherein said wiring formation step includes a step of electrolytic plating of said wiring layer.

11. A semiconductor device production method as claimed in claim 5, wherein said wiring formation step includes a step of electrolytic plating of said wiring layer.

12. A semiconductor device production method as claimed in claim 6, wherein said wiring formation step includes a step of electrolytic plating of said wiring layer.

13. A semiconductor device production method as claimed in claim 7, wherein said seed formation step forms said seed layer from a material not melted by a plating liquid.

14. A semiconductor device production method as claimed in claim 8, wherein said seed formation step forms said seed layer from a material not melted by a plating liquid.

15. A semiconductor device production method as claimed in claim 9, wherein said seed formation step forms said seed layer from a material not melted by a plating liquid.

16. A semiconductor device production method as claimed in claim 10, wherein said seed formation step forms said seed layer from a material not melted by a plating liquid.

17. A semiconductor device production method as claimed in claim 1, wherein said seed formation step includes formation of said seed layer from copper; and said wiring formation step includes a step of forming said wiring layer from copper.

18. A semiconductor device production method as claimed in claim 2, wherein said seed formation step includes formation of said seed layer from copper; and said wiring formation step includes a step of forming said wiring layer from copper.

19. A semiconductor device production method as claimed in claim 3, wherein said seed formation step includes formation of said seed layer from copper; and said wiring formation step includes a step of forming said wiring layer from copper.

20. A semiconductor device production method as claimed in claim 4, wherein said seed formation step includes formation of said seed layer from copper; and said wiring formation step includes a step of forming said wiring layer from copper.

21. A semiconductor device comprising:

an insulation layer formed on a substrate and having a groove for forming a wiring layer in a predetermined region;

a barrier layer formed on an inner wall of said groove for preventing diffusion of atoms constituting said wiring layer, into said insulation layer;

a seed layer formed on said barrier layer so as to serve as a kernel of crystal growth when forming said wiring layer and having substantially (111) orientation; and a wiring layer formed on said seed layer so as to bury said groove and having substantially (111) orientation.

22. A semiconductor device as claimed in claim 21, wherein said seed layer is formed on said barrier layer on a bottom of said groove.

23. A semiconductor device as claimed in claim 21, wherein said seed layer is made from copper; and said wiring layer is made from copper.

24. A semiconductor device as claimed in claim 22, wherein said seed layer is made from copper; and said wiring layer is made from copper.

* * * * *